(12) United States Patent
McKee et al.

(10) Patent No.: US 6,418,029 B1
(45) Date of Patent: Jul. 9, 2002

(54) INTERCONNECT SYSTEM HAVING VERTICALLY MOUNTED PASSIVE COMPONENTS ON AN UNDERSIDE OF A SUBSTRATE

(76) Inventors: James S. McKee, 917 SW. 18th St., Fort Lauderdale, FL (US) 33315; Kevin J. Pieper, 10851 NW. 10th Pl., Coral Springs, FL (US) 33071; Andrew J. Butterfield, 681 NW. 151st Ave., Pembroke Pines, FL (US) 33028

( * ) Notice: Subject to any disclaimer, the term of this patent is extended or adjusted under 35 U.S.C. 154(b) by 0 days.

(21) Appl. No.: 09/515,078

(22) Filed: Feb. 28, 2000

(51) Int. Cl.[7] .............................. H05K 1/11; H05K 7/02
(52) U.S. Cl. ................. 361/760; 361/763; 361/782; 361/803; 174/260; 174/263
(58) Field of Search ................. 361/760, 782, 361/769, 765, 803; 174/250, 260, 261–266; 257/738

(56) References Cited

U.S. PATENT DOCUMENTS

| | | | |
|---|---|---|---|
| 4,658,327 A | | 4/1987 | Hernandez |
| 4,789,847 A | * | 12/1988 | Sakamoto et al. .......... 333/185 |
| 4,994,936 A | | 2/1991 | Hernandez |
| 5,105,340 A | * | 4/1992 | Lawrence ................. 361/760 |
| 5,212,402 A | | 5/1993 | Higgins, III .............. 257/532 |
| 5,241,133 A | | 8/1993 | Mullen, III et al. ....... 174/52.4 |
| 5,281,846 A | | 1/1994 | Kaiser .................... 257/528 |
| 5,598,036 A | * | 1/1997 | Ho ........................ 257/738 |
| 5,694,296 A | * | 12/1997 | Urbish et al. ............. 361/774 |
| 5,729,438 A | * | 3/1998 | Pieper et al. ............. 361/760 |
| 5,741,729 A | * | 4/1998 | Senia ..................... 438/125 |
| 6,040,983 A | * | 3/2000 | Baudouin et al. .......... 361/760 |

FOREIGN PATENT DOCUMENTS

JP    63-244631    10/1988

* cited by examiner

*Primary Examiner*—Jayprakash N. Gandhi
(74) *Attorney, Agent, or Firm*—Frank M. Scutch, III

(57) ABSTRACT

An interconnect system for use with interposers or chip carriers provides highly efficient area utilization by attaching very small chip components (50) such as resistors or capacitors to the solder pads (30) on the underside of a carrier substrate (10) such that only one end (55) of the chip component is attached to the solder pad, while the other end (56) is suspended free in space. When the interposer or chip carrier is soldered to a main printed circuit board, the free end of the chip component is soldered to a corresponding pad on the printed circuit board. The vertically mounted chip components provide an electrical function, such as decoupling, and also provide an electrical interconnection between the interposer and the printed circuit board. The interposer has electrical vias that pass vertically through the substrate from the solder pads to a conductive circuitry pattern on the top side, which also contains an integrated circuit die or an array of larger discrete chip components. Solder spheres (40) may also be used on some of the solder pads.

11 Claims, 4 Drawing Sheets

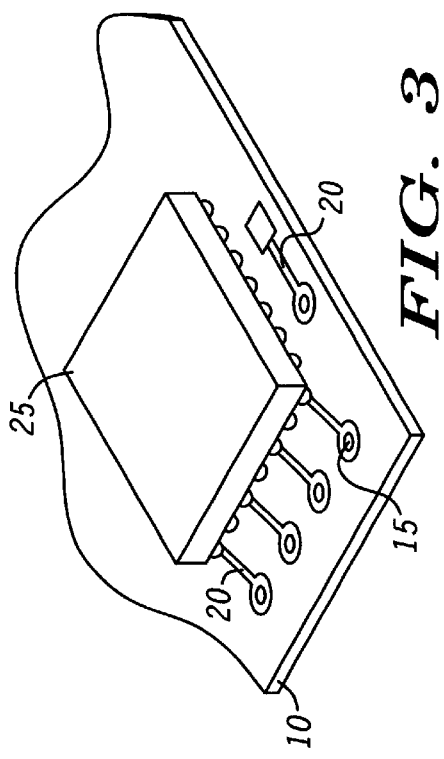
FIG. 3
FIG. 6
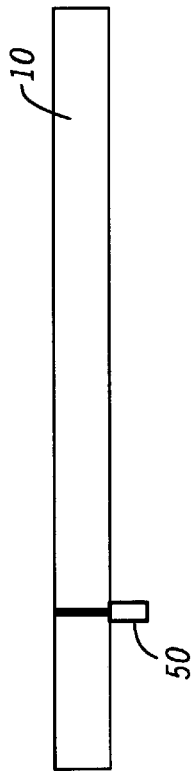
FIG. 7
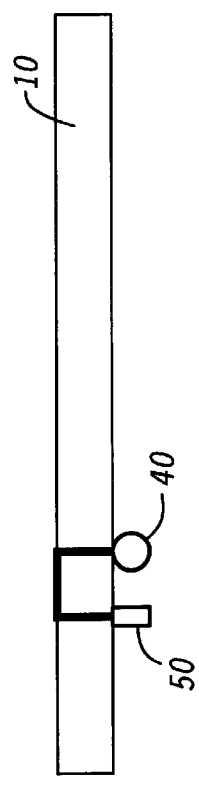
FIG. 4
FIG. 5

INTERCONNECT SYSTEM HAVING VERTICALLY MOUNTED PASSIVE COMPONENTS ON AN UNDERSIDE OF A SUBSTRATE

TECHNICAL FIELD

This invention relates to the field of integrated circuits packaged in a molded housing. More particularly, this invention relates to a method of suppressing noise (e.g. decoupling) from the voltage to ground distribution circuit in integrated circuit packages such as surface mounted leadless chip carriers.

BACKGROUND

It is well known in the field of microelectronics that high frequency operation, particularly the switching of integrated circuits (IC), can result in transient energy being coupled into the power supply circuit. It is also well known that integrated circuits are becoming more dense (more gates per unit area of silicon/or gallium arsenide), more powerful (more watts per unit area of IC chip), and faster with higher clock rate frequencies and with smaller rise times. All of these recent and continued developments make the problem of suppressing noise in the power bus (produced by a large amount of simultaneous gates switching) even more serious than in the past.

Generally, the prevention of the coupling of undesired high frequency noise or interference into the power supply for an integrated circuit is accomplished by connecting a decoupling capacitor between the power and the ground leads of the IC. Conventional methods of decoupling (noise suppression) include the use of decoupling capacitors external to the IC package, such as monolithic multilayer ceramic chip capacitors. One external connection scheme of this type which has been found to be quite successful is to mount a decoupling capacitor underneath an integrated circuit. Examples of these decoupling capacitors are found in U.S. Pat. Nos. 4,475,143, 4,502,101 and 4,748,537. These patents disclose decoupling capacitors which are particularly well suited for pin grid array and plastic leaded chip carrier packages.

Still other decoupling connection schemes are known. For example, multilayer capacitor (MLC) chips have been placed on top of pin grid array (PGA) ceramic IC packages with interconnections built-in from the surface of the PGA package down to the proper places in internal circuitry of the package. In still some other cases, schemes have been devised to incorporate a MLC chip into a specially configured IC lead frame, but due to production difficulties, this approach has not become widely accepted. Attempts have also been made to build a capacitive layer into a PGA ceramic package (and into a leadless ceramic chip carrier), by using thin layers of alumina or other adequate ceramic dielectric material. Again, this approach has not found wide acceptance.

Another approach engendered by U.S. Pat. No. 4,994,936 utilizes a flat decoupling capacitor that is attached directly to the IC lead frame and thereafter encapsulated within the molded package along with the IC chip, resulting in a decoupling scheme which is internal to the molded IC package. The capacitor is of the parallel plate type and is a thin layer of ceramic dielectric sandwiched between top and bottom conductors. The top conductor is attached to the die bar of the lead frame using an adhesive. Leads extending from the capacitors are attached to appropriate fingers of the lead frame to effect mechanical and electrical contact.

In spite of all these innovations, most decoupling capacitors are discrete MLC soldered to the main PCB near the IC package. Obviously, there continues to be a need for improved connection schemes for decoupling undesired high frequency noise from integrated circuits wherein the inductance within the decoupling loop is reduced to as low a level as possible.

BRIEF DESCRIPTION OF THE DRAWINGS

FIG. 3 is an isometric view of the topside of the interposer of FIG. 1, with an integrated circuit die attached to a conductive circuitry pattern in accordance with the invention.

FIG. 4 is an electrical schematic of a capacitor in parallel with an integrated circuit.

FIG. 5 is cross-sectional view representing one embodiment of the physical connection and routing of the schematic shown in FIG. 4.

FIG. 6 is an electrical schematic of a capacitor in series with an integrated circuit.

FIG. 7 is cross-sectional view representing one embodiment of the physical connection and routing of the schematic shown in FIG. 6.

DETAILED DESCRIPTION OF THE PREFERRED EMBODIMENT

Figure 1:
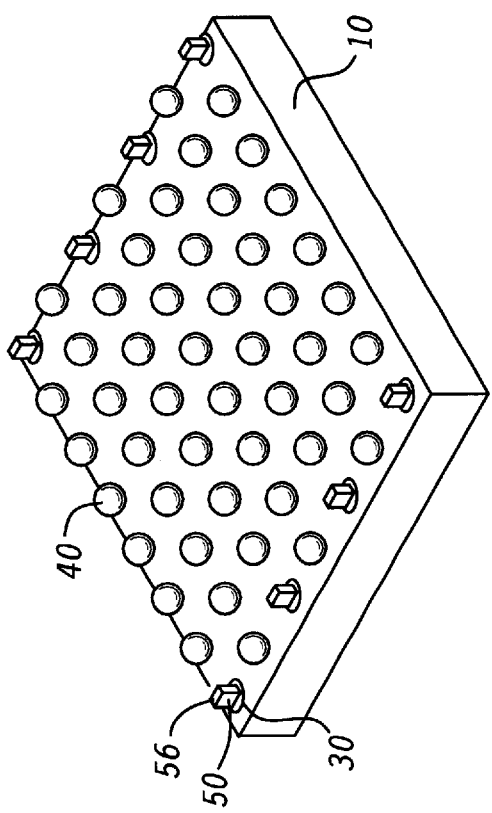
FIG. 1 is an isometric view of the underside of an interposer having solder balls and small discrete chip components attached to an array of solder pads in accordance with the invention.

One way in which decoupling capacitors have been used in the past is by mounting a discrete decoupling capacitor next to a semiconductor device on a substrate, such as a PC board. Conductive traces on the substrate are used to electrically couple the decoupling capacitor to power and ground pins of the semiconductor device. Another approach is to attach a discrete decoupling capacitor directly to the face of a semiconductor die such that the decoupling capacitor is electrically coupled to power and ground bond pads of the die or to power and ground leads. Each of these methods serves to negate the effects of rapid voltage swings in a semiconductor device to a degree. However, the main disadvantage is that the capacitors require additional area on a substrate or PC board or they increase the size of the semiconductor package. It is desirable to have a decoupling capacitor which is as close to the die as possible in order to shorten the interconnection distance, thereby lowering inductance.

The present invention provides an interconnect system for use with interposers or chip carriers that utilizes PCB and semiconductor package area efficiently by attaching very small chip components such as resistors or capacitors to the solder pads on the underside of the substrate such that only one end of the chip component is attached to the solder pad, while the other end is suspended free in space. When the interposer or chip carrier is soldered to a main printed circuit board, the free end of the chip component is soldered to a corresponding pad on the printed circuit board. The vertically mounted chip components provide an electrical function, such as decoupling, and also provide an electrical interconnection path between the interposer and the printed circuit board. The interposer has electrical interconnections that pass vertically through the substrate from the solder pads to a conductive circuitry pattern on the top side, which also contains an integrated circuit die or an array of larger discrete chip components.

While the specification concludes with claims defining the features of the invention that are regarded as novel, it is believed that the construction, method of operation and advantages of the invention will be better understood from a consideration of the following description in conjunction with the drawing figures, in which like reference numerals are carried forward.

Figure 2:
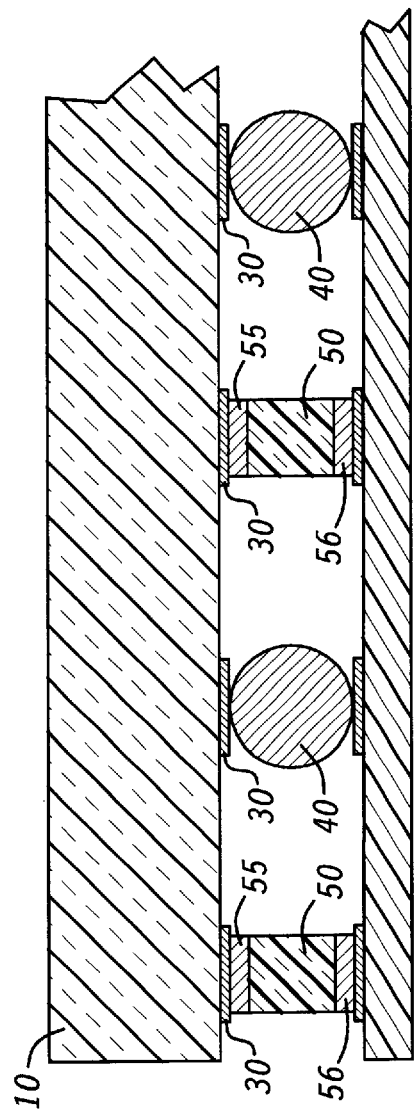
FIG. 2 is a cross sectional view of FIG. 1 through section 2—2.

Referring now to FIGS. 1–3, a dielectric substrate 10 such as alumina ceramic, glass reinforced polymers (for example, epoxy, polyimide, polyimide, polyethylene, polytetrafluoroethylene, or polyester) or a flexible film such as polyimide or polyethylene terephthalate serves as a carrier or interposer. On the top side of the substrate 10 is a conductive circuitry pattern 20 typical of that found on conventional chip carriers. These types of conductive circuitry patterns are well known to those skilled in the art, and the reader is referred to, among others, U.S. Pat. No. 5,241,133, Mullen et al., which is hereby incorporated by reference, for further details on but one example of such a pattern. In one embodiment of the invention, an integrated circuit (IC) die 25 is attached to the conductive circuitry pattern 20 either by flip chip attachment, by wire bonding, or by tape automated bonding (TAB). The IC 25 can be encapsulated or covered to protect it from the environment, or it can be left bare, as in the case of flip chip mounting. A series of electrical interconnections 15 such as vias or plated through holes connect various points of the conductive circuitry pattern 20 to corresponding solder pads 30 on the bottom or underside of the substrate 10. Typically, the solder pads 30 are arranged in a regular array or matrix, but the arrangement of the pads is left to the whims of the designer and can assume a wide variety of configurations or layouts, all of which are intended to fall within the metes and bounds of our claimed invention. The array of solder pads on the underside of conventional ball grid array (BGA) chip carriers is typically populated or bumped with solder spheres to aid in attaching the carrier to a main PCB. These same solder spheres 40 can be attached to some of the solder pads 30 on our substrate 10 in the same manner and for the same purpose as in conventional art BGA packages. However, the remainder of the solder pads 30 have a very small chip component 50 attached to them. The chip component 50 is typically a very small chip resistor, chip capacitor or chip inductor, and we find that the most suitable size component is 0.3 mm wide×0.6 mm long. These small chip components are commonly used in high-density microelectronic circuits, and are typically formed on an alumina ceramic body. The component 50 is vertically mounted such that only one end or termination 55 of the component is attached to the solder pad 30 and the other end or termination 56 is suspended in free space and is not connected to any of the other solder pads on the substrate 10. Although the attachment of, for example, decoupling capacitors, on the bottom side of a substrate has been known in the prior art (for example, Japanese laid open patent 63-244631), all the prior art depicts the chip components as being soldered at both ends to solder pads on the same substrate, and none of the prior art teaches or suggests soldering only one end of the component to the carrier substrate.

Referring specifically now to FIG. 2, all of the component free ends or terminations 56 that are not attached to the carrier substrate 10 are soldered to a main PCB (commonly referred to as a 'mother board') when the carrier 10 is attached to the main PCB. In addition, the solder spheres 40 are also soldered to the main PCB at the same time. The solder spheres 40 are sized such that the diameter of the sphere is approximately equivalent to the length of the chip component, i.e. approximately 0.5 mm diameter. Thus, all of the free end terminations 56 are essentially co-planar with the tangential edges of the solder sphere 40. By vertically attaching the chip component 50 to the solder pad 30, we have achieved dual utilization of the real estate devoted to the solder pads 30. We have provided a location for connection of a chip component and at the same time have provided an electrical interconnection path between the interposer or carrier substrate 10 and the main PCB. Prior art arrangements require that at least two separate connections be made in order to accomplish the same feat, and they consume more real estate. Our vertically mounted components 50 provide an electrical interconnection path between the main PCB and the IC 25 and provide a discrete electrical function without using any additional PCB surface area.

This invention can be used for any discrete component in series or parallel with the input or output (I/O) signal on the IC. Components in series do not require special design considerations, however, components in parallel will require an additional circuit line. This can be compensated for by rerouting common lines together on the interposer board, thus freeing up additional I/O. FIGS. 4–7 show the electrical schematic and the corresponding physical layouts for series and parallel configurations. Note that in both cases an electrical interconnection is made through the substrate to the IC by means of a via or plated through hole.

By mounting the chip components vertically on the underside of the interposer and under the IC, no separate routing is required for the passive components, since the electrical path is made through the part. In effect, these parts are 'removed' from the PCB design altogether by transferring them to the carrier, thus freeing up routing space for additional runners and vias. This is a critical problem when routing and attaching high devices. In order to illustrate the effectiveness of our invention, a compact Motorola cellular telephone was analyzed and reconfigured. When designed according to the prior art methods, the telephone contained 5 integrated circuits having a total of 432 I/O and 481 passive chip components (capacitors, resistors and inductors). Analysis of the telephone revealed that 90 of these passive components were in series or parallel configurations and thus could be relocated under the IC carriers and mounted vertically. After redesigning the circuitry pattern on the telephone to accommodate our vertical mounting scheme, we found that we were able to reduce the number of components mounted to the main PCB in conventional fashion by 18.7%, thus freeing up a considerable amount of space for additional circuitry or, alternatively, reducing the overall size of the PCB.

Although FIGS. 1 and 2 generally depict the use of both solder spheres 40 and chip components 50 mounted to the array of solder pads 30, the skilled designer can certainly lay out a chip carrier or interposer that provides vertically mounted chip components at every solder pad and does not use any solder spheres for attachment to the main PCB.

Figure 8:
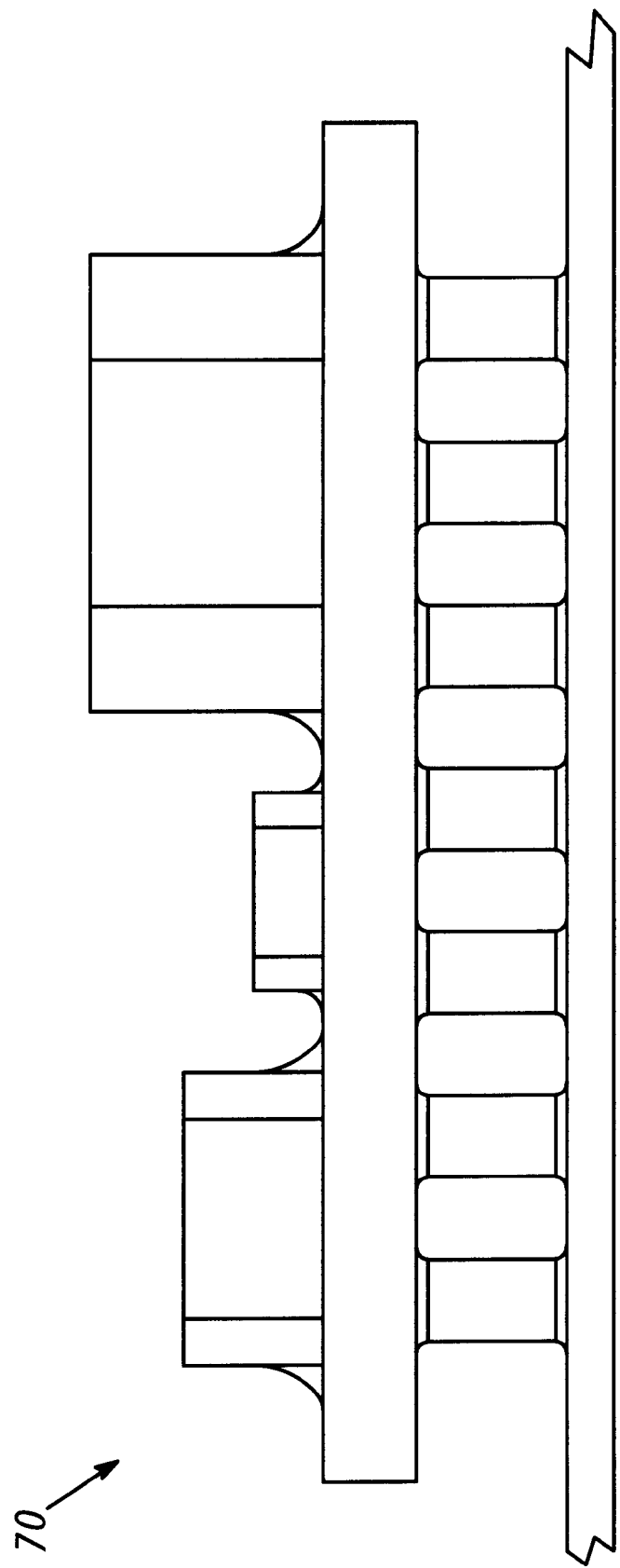
FIG. 8 is a side view of an alternate embodiment of the invention.
Figure 9:
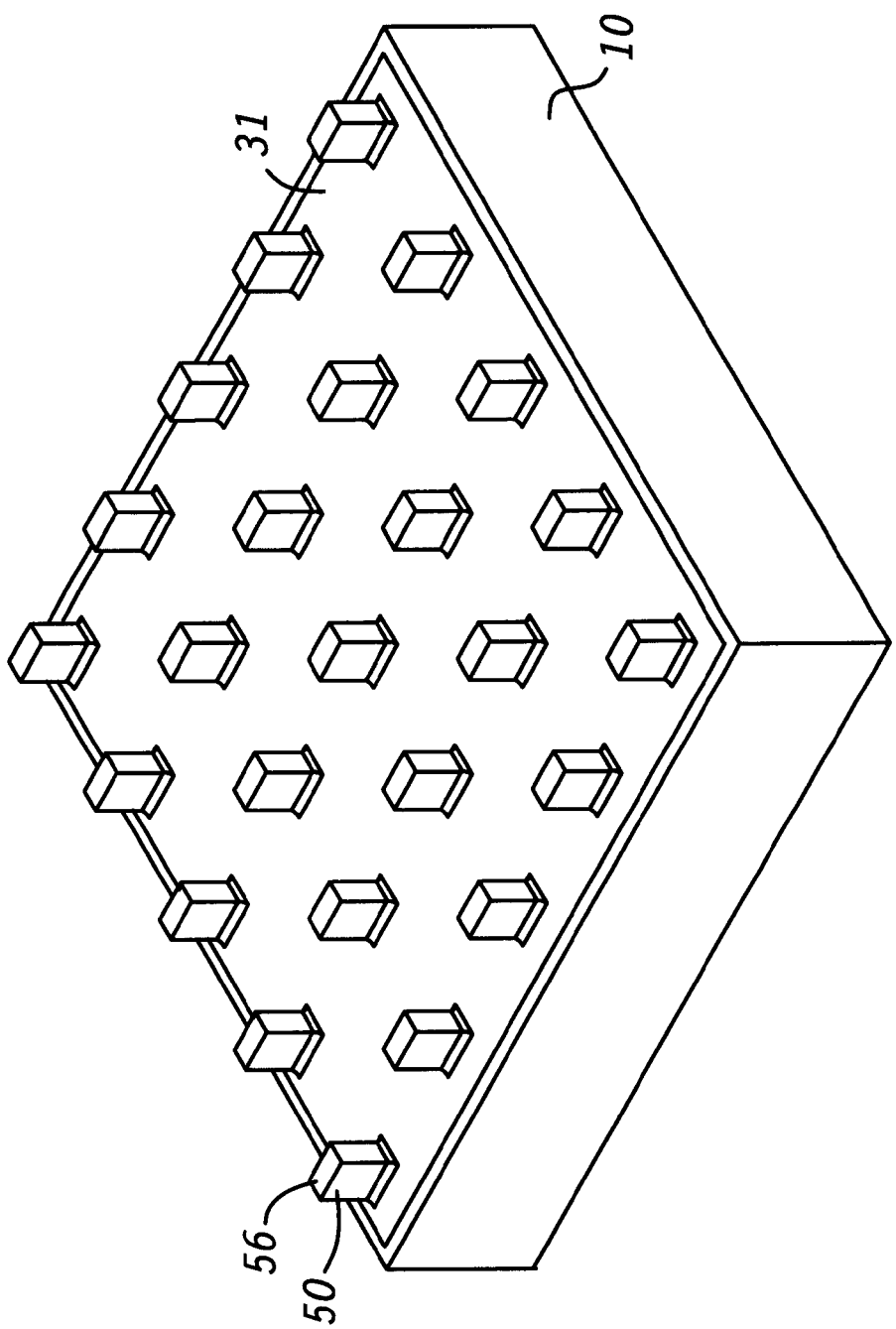
FIG. 9 is an isometric view of the underside of an interposer having small discrete chip components attached to a ground plane in accordance with an alternate embodiment of the invention.

An alternative embodiment of the invention is shown in FIG. 8 where an array or network 70 of discrete components such as a resistor network, a capacitor network, a resistor/capacitor network or a resistor/capacitor/inductor network is mounted on the top side of the interposer or carrier 10 instead of an IC. Typically, the components in the array 70 are larger than the chip components 50 used on the underside of the substrate 10, and various portions of the network 70 are connected to the vertically mounted components 50 by means of vias or plated through holes. FIG. 9 shows still another embodiment of the invention, where an array of tiny discrete components are attached to a ground plane. In this embodiment, there is no circuitry pattern on either side of the interposer 10, but the bottom side (which is shown facing the viewer in FIG. 9) is a ground plane 31 of metal (either continuous or perforated) that has a plurality of discrete passive chip components 50 soldered thereon, each of the chip components standing on end. This arrangement allows one to create an interposer of module that can be placed on a main PCB that connects all the components to a common ground. This alleviates having to route a ground conductor or conductors on the main PCB, further saving real estate by utilizing the 'Z' direction.

In summary, the problems and deficiencies of the prior art are overcome or alleviated by the interconnection scheme of the present invention which is particularly well suited for use with surface mount integrated circuit packages incorporating a ball grid array. The close proximity between the vertically mounted decoupling capacitors and IC chip provides improved noise decoupling with very low inductance. By attaching the chip component vertically to the solder pads on the bottom of the carrier, an improvement in area utilization results in that the chip component provides not only a discrete electrical function, but it also functions as an interconnect path between the carrier and the main PCB. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An interconnect system for connecting an interposer to a printed circuit board, comprising:
    a dielectric interposer substrate having a top side and a bottom side, the top side having a conductive circuitry pattern thereon and having one or more electronic components electrically connected to said conductive circuitry pattern, and the bottom side having a plurality of solder pads arranged in an array format;
    electrical interconnections passing vertically through the substrate from the conductive circuitry pattern to the solder pads; and
    a passive component having a solderable termination at first and second opposing ends, said passive component mounted vertically on one or more of the solder pads belonging to the dielectric interposer such that said first end of the passive component is soldered to a solder pad and such that said second end is not connected to any of said solder pads; and
    wherein said second end of said passive component functions as an electrical interconnect to the printed circuit board.

2. The interconnect system as described in claim 1, wherein said one or more electronic components on the top side comprise one or more integrated circuits.

3. The interconnect system as described in claim 1, wherein said vertically mounted passive component is a resistor, a capacitor or an inductor.

4. The interconnect system as described in claim 1, further comprising a solder ball soldered to one or more of said solder pads.

5. The interconnect system as described in claim 1, wherein one passive component is vertically mounted on every solder pad.

6. The interconnect system as described in claim 1, wherein said one or more electronic components electrically connected to said conductive circuitry pattern comprises a resistor network, a capacitor network, a resistor/capacitor network or a resistor/capacitor/inductor network.

7. The interconnect system as described in claim 1, wherein said one or more electronic components electrically connected to said conductive circuitry pattern are each larger than any of the vertically mounted passive components.

8. An interconnect system for connecting an interposer to a printed circuit board, comprising:
    a dielectric interposer substrate having a top side and a bottom side, the top side having a conductive circuitry pattern thereon and an integrated circuit electrically connected to said conductive circuitry pattern, and the bottom side having a plurality of solder pads arranged in an array format;
    a chip resistor or a chip capacitor vertically mounted on some of the solder pads of the dielectric interposer such that only one end of the chip component is soldered to a solder pad; and
    electrical interconnections passing vertically through the substrate from the solder pads to the conductive circuitry pattern.

9. An interconnect system for connecting a chip carrier to a printed circuit board, comprising:
    a dielectric substrate having a top side and a bottom side, the top side having a conductive circuitry pattern thereon and an integrated circuit electrically connected to said conductive circuitry pattern, and the bottom side having a plurality of solder pads arranged in an array format;
    electrical interconnections passing vertically through the dielectric substrate from the conductive circuitry pattern to the solder pads;
    a plurality of chip resistors or chip capacitors vertically attached to some of the solder pads of the dielectric substrate such that only one end of each of the plurality of chip resistors or chip capacitors is soldered to the solder pads; and
    a plurality of solder spheres attached to those solder pads that do not contain a vertically mounted chip resistor or chip capacitor.

10. An interconnect system for connecting an interposer to a printed circuit board, comprising:
    a dielectric interposer substrate having a ground plane on a bottom side and having a plurality of passive components each having a solderable termination at first and second opposing ends, said passive components mounted vertically on the ground plane such that only said first end of the passive component is soldered to a pad on the ground plane and such that said second end is not connected to the ground plane; and
    wherein said second end of said passive component functions as an electrical interconnect to the printed circuit board.

11. The interconnect system as described in claim 10, wherein the solderable termination at said second end of the component is soldered to the printed circuit board to create an array having a common ground point.

* * * * *